(12) United States Patent
Sandhu et al.

(10) Patent No.: US 7,153,769 B2
(45) Date of Patent: Dec. 26, 2006

(54) METHODS OF FORMING A REACTION PRODUCT AND METHODS OF FORMING A CONDUCTIVE METAL SILICIDE BY REACTION OF METAL WITH SILICON

(75) Inventors: Gurtej S. Sandhu, Boise, ID (US); Guy T. Blalock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 332 days.

(21) Appl. No.: 10/822,118

(22) Filed: Apr. 8, 2004

(65) Prior Publication Data
US 2005/0227487 A1 Oct. 13, 2005

(51) Int. Cl.
*H01L 21/4763* (2006.01)

(52) U.S. Cl. ...................... 438/649; 438/630

(58) Field of Classification Search ............... 438/581, 438/583, 630, 649, 651, 655, 664, 682, 721, 438/755
See application file for complete search history.

(56) References Cited

U.S. PATENT DOCUMENTS

| | | | |
|---|---|---|---|
| 3,349,474 A | 10/1967 | Rauscher | |
| 3,772,101 A | 11/1973 | Chumbres et al. | |
| 4,086,074 A | 4/1978 | Minot et al. | |
| 4,622,735 A | 11/1986 | Shibata | |
| 4,683,645 A | 8/1987 | Naguib et al. | |
| 4,693,910 A | 9/1987 | Nakajima et al. | |
| 4,766,090 A | 8/1988 | Coquin et al. | |
| 5,099,304 A | 3/1992 | Takemura et al. | |
| 5,236,865 A | 8/1993 | Sandhu et al. | |
| 5,406,123 A | 4/1995 | Narayan ................ | 257/767 |
| 5,444,024 A | 8/1995 | Anjum et al. | |
| 5,470,784 A | 11/1995 | Coleman ............... | 437/101 |
| 5,470,794 A | 11/1995 | Anjum et al. | |
| 5,670,298 A | 9/1997 | Hur | |
| 5,677,102 A | 10/1997 | Shiihara | |
| 5,904,517 A | 5/1999 | Gardner et al. ............ | 438/197 |
| 5,955,244 A | 9/1999 | Duval ...................... | 430/314 |
| 5,994,194 A | 11/1999 | Lammert | |

(Continued)

FOREIGN PATENT DOCUMENTS

EP 0 851 473 A2 1/1998

(Continued)

OTHER PUBLICATIONS

U.S. Appl. No. 10/932,218, filed Sep. 1, 2004, Basceri et al.

(Continued)

*Primary Examiner*—David Vu
(74) *Attorney, Agent, or Firm*—Wells St. John P.S.

(57) ABSTRACT

A method of forming a reaction product includes providing a semiconductor substrate comprising a first material. A second material is formed over the first material. The first and second materials are of different compositions, and are proximate one another at an interface. The first and second materials as being proximate one another at the interface are capable of reacting with one another at some minimum reaction temperature when in an inert non-plasma atmosphere at a pressure. The interface is provided at a processing temperature which is at least 50° C. below the minimum reaction temperature, and is provided at the pressure. With the interface at the processing temperature and at the pressure, the substrate is exposed to a plasma effective to impart a reaction of the first material with the second material to form a reaction product third material of the first and second materials over the first material. Other aspects and implementations are contemplated.

114 Claims, 5 Drawing Sheets

U.S. PATENT DOCUMENTS

| | | | |
|---|---|---|---|
| 5,998,264 A | 12/1999 | Wu | 438/260 |
| 6,037,239 A | 3/2000 | Jennings | |
| 6,096,621 A | 8/2000 | Jennings | |
| 6,096,634 A | 8/2000 | Nguyen | |
| 6,130,140 A | 10/2000 | Gonzalez | |
| 6,133,105 A | 10/2000 | Chen et al. | |
| 6,133,116 A | 10/2000 | Kim et al. | |
| 6,156,674 A | 12/2000 | Li et al. | |
| 6,177,235 B1 | 1/2001 | Francou et al. | |
| 6,180,465 B1 | 1/2001 | Gardner et al. | 438/291 |
| 6,207,485 B1 | 3/2001 | Gardner et al. | 438/216 |
| 6,238,994 B1 | 5/2001 | Derderian et al. | |
| 6,255,035 B1 | 7/2001 | Minter et al. | |
| 6,277,709 B1 | 8/2001 | Wang et al. | |
| 6,277,728 B1 | 8/2001 | Ahn et al. | |
| 6,281,100 B1 | 8/2001 | Yin et al. | |
| 6,291,363 B1 | 9/2001 | Yin et al. | |
| 6,297,527 B1 | 10/2001 | Agarwal et al. | |
| 6,350,560 B1 | 2/2002 | Sahbari | 430/325 |
| 6,376,149 B1 | 4/2002 | Grober et al. | |
| 6,380,611 B1 | 4/2002 | Yin et al. | |
| 6,383,723 B1 | 5/2002 | Iyer et al. | |
| 6,399,982 B1 | 6/2002 | Derderian et al. | |
| 6,440,793 B1 | 8/2002 | Divakaruni et al. | |
| 6,465,325 B1 | 10/2002 | Ridley et al. | |
| 6,511,896 B1 | 1/2003 | Basceri et al. | |
| 6,548,854 B1 | 4/2003 | Kizilyalli et al. | 257/310 |
| 6,582,861 B1 | 6/2003 | Buxbaum et al. | |
| 6,582,888 B1 | 6/2003 | Herbst et al. | |
| 6,608,343 B1 | 8/2003 | Derderian et al. | |
| 6,613,240 B1 | 9/2003 | Skinner et al. | |
| 6,617,250 B1 | 9/2003 | Basceri et al. | |
| 6,649,466 B1 | 11/2003 | Basceri et al. | |
| 6,720,638 B1 | 4/2004 | Tran | |
| 6,744,093 B1 | 6/2004 | Agarwal et al. | |
| 6,746,916 B1 | 6/2004 | Agarwal et al. | |
| 6,753,618 B1 | 6/2004 | Basceri et al. | 257/915 |
| 6,777,739 B1 | 8/2004 | Agarwal et al. | |
| 6,780,728 B1 | 8/2004 | Tran | |
| 6,780,766 B1 | 8/2004 | Basceri et al. | |
| 6,817,086 B1 | 11/2004 | Lu et al. | |
| 6,838,363 B1 * | 1/2005 | Wieczorek et al. | 438/528 |
| 6,844,131 B1 | 1/2005 | Oberlander et al. | 430/270.1 |
| 6,900,497 B1 | 5/2005 | Agarwal et al. | |
| 6,956,980 B1 | 10/2005 | Nagata et al. | |
| 2001/0006759 A1 | 7/2001 | Shipley, Jr. et al. | |
| 2002/0076879 A1 | 6/2002 | Lee et al. | |
| 2002/0196651 A1 | 12/2002 | Weis | |
| 2003/0013272 A1 | 1/2003 | Hong et al. | |
| 2003/0045060 A1 | 3/2003 | Ahn et al. | 438/287 |
| 2003/0045078 A1 | 3/2003 | Ahn et al. | 438/585 |
| 2003/0205729 A1 | 11/2003 | Basceri et al. | 257/200 |
| 2003/0213987 A1 | 11/2003 | Basceri et al. | 257/296 |
| 2003/0219942 A1 | 11/2003 | Choi et al. | 438/253 |
| 2004/0043228 A1 | 3/2004 | Derderian et al. | 428/446 |
| 2004/0046197 A1 | 3/2004 | Basceri et al. | 257/296 |
| 2004/0245559 A1 | 12/2004 | Pontoh et al. | 257/306 |
| 2004/0245560 A1 | 12/2004 | Pontoh et al. | 257/309 |
| 2005/0244571 A1 | 11/2005 | Walheim et al. | |

FOREIGN PATENT DOCUMENTS

| | | |
|---|---|---|
| JP | 2002-323775 | 11/2002 |

OTHER PUBLICATIONS

Chang et al., Silicon surface treatments in advanced MOS gate processing, Microelectronic Engineering, (2004), pp. 130-135.

Lemberger et al., Electrical characterization and reliability aspects of zirconium silicate films obtained from novel MOCVD precursors, Microelectronic Engineering (2004), pp. 315-320.

Lu et al., Effects of the $TaN_x$ interface layer on doped tantalum oxide high-$k$ films, VACUUM (2004), pp. 1-9.

Robertson et al., Atomic structure, band offsets, growth and defects at high-$k$ oxide:Si enterfaces, Microelectronic Engineering (2004) pp. 112-120.

Singh et al., High and Low Dielectric Constant Materials, The Electrochemical Society *Interface*, Summer 1999, pp. 26-30.

ABSTRACT: How to Eliminate Voiding in Porous-Low-k Dielectrics and The Mechanism of Void Formation; Lin et al.; 4 pages.

COB Stack DRAM Cell Technology beyond 100 nm Technology Node; Yongjik Park & Kinam Kim; pp. 349.1-349.3.

U.S. Appl. No. 10/609,311, filed Jun. 2003, Yates.

U.S. Appl. No. 10/655,997, filed Sep. 2003, Daley.

U.S. Appl. No. 10/879,367, filed Jun. 2004, Blalock et al.

U.S. Appl. No. 10/689,958, filed Oct. 20, 2003, Basceri.

U.S. Appl. No. 10/690,029, filed Oct. 20, 2003, Derderian et al.

ABSTRACT: Basceri et al., *Atomic Layer Deposition for Nanoscale CU Metalization*, 10 pages (pre-Apr. 2004).

En et al., *Plasma immersion ion implantation reactor design considerations for oxide charging*, 85 Surface And Coatings Technology 64-69 (1966).

Ku et al., *The Application of Ion Beam Mixing, Doped Silicide, and Rapid Thermal Processing of Self-Aligned Silicide Technology*, 137 J. Electrochem. Soc. No. 2, pp. 728-740 (Feb. 1990).

Rubin et al., *Shallow-Junction Diode Formation by implantation of Arsenic and Boron Through Titanium-Silicide Films and . . .* , 17 IEEE Transactions on Electron Devices, No. 1, pp. 183-190 (Jan. 1990).

\* cited by examiner

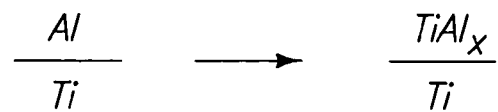
FIG. 5
FIG. 6
TiN —— B —— BN
FIG. 7
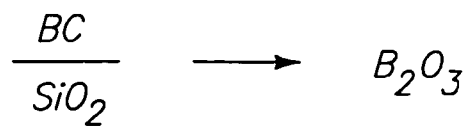
FIG. 8

METHODS OF FORMING A REACTION PRODUCT AND METHODS OF FORMING A CONDUCTIVE METAL SILICIDE BY REACTION OF METAL WITH SILICON

TECHNICAL FIELD

This invention relates to methods of forming a reaction product and to methods of forming a conductive metal silicide by reaction of metal with silicon.

BACKGROUND OF THE INVENTION

Integrated circuits typically use various combinations of insulative materials, conductive materials, and semiconductive materials (including conductively doped semiconductive materials). One type of conductive material which is utilized is elemental metals. In the context of this document, an "elemental metal" is defined to mean any one or more metal element(s) in element form, including any alloy of two or more metal elements. In many instances, it is desired to form a metal into electrical connection with a crystalline silicon substrate, for example conductively doped crystalline silicon. However, the physical contact of an elemental metal with a crystalline silicon substrate inherently creates undesired excessive electrical resistance between the two materials.

One common way of reducing this resistance is to form an interfacing silicide region at the junction or interface of the metal with the silicon. Thereby, a silicon-silicide-metal interfacing electrical connection is formed. One manner of forming the silicide is merely by heating the substrate with the two contacting layers to a suitably high temperature for a sufficient period of time, typically in an inert atmosphere, to cause a reaction of metal and silicon to form the metal silicide. However in some instances, it might be problematic or at least undesirable to expose the substrate to the minimum temperature at which the silicide will form.

Further, integrated circuitry fabrication continues to strive to make ever denser and smaller electronic devices of the circuitry. One place where silicide contact structures are utilized is in the electrical connection of source/drain diffusion regions of field effect transistors with overlying conductive metal lines. As the device components get smaller and denser, it is highly desirable to precisely control the amount of silicide which is formed in such contacts, as well as in other devices where silicide interfaces between metal and silicon are desired to be formed. This is at least in part due to thermal energy required to drive the silicidation reaction, which can lead to thickness variation of the silicide formed over different areas of the substrate and to undesired suicide roughness which can cause shorts in the finished circuitry.

For example in some instances in present-generation processing, it is desirable to fabricate the silicide regions over the substrates to have thicknesses of from 50 Angstroms to 100 Angstroms. Further, it is expected that the thickness of silicide regions in later-generation processing will fall below 50 Angstroms. Regardless, the variation in thickness of silicide regions formed over a substrate using typical prior art processing has been found to be anywhere from 20 Angstroms to 25 Angstroms across the substrate. This variability is undesirable and constitutes a 20% to 25% thickness variation for desired 100 Angstroms thick silicide regions, and a 40% to 50% variation in thickness for desired 50 Angstroms thick silicide regions. It would be desirable to develop methods which enable tighter thickness control of silicide regions which are formed across a substrate, and particularly where the silicide regions being formed have thicknesses that are no greater than 100 Angstroms where the above problem particularly manifests.

While the invention was motivated in addressing the above issues, it is in no way so limited. The invention is only limited by the accompanying claims as literally worded, without interpretative or other limiting reference to the specification, and in accordance with the doctrine of equivalents.

SUMMARY

The invention comprises methods of forming a reaction product and methods of forming a conductive metal suicide by reaction of metal with silicon. In one implementation, a method of forming a reaction product includes providing a semiconductor substrate comprising a first material. A second material is formed over the first material. The first and second materials are of different compositions, and are proximate one another at an interface. The first and second materials as being proximate one another at the interface are capable of reacting with one another at some minimum reaction temperature when in an inert non-plasma atmosphere at a pressure. The interface is provided at a processing temperature which is at least 50° C. below the minimum reaction temperature, and is provided at the pressure. With the interface at the processing temperature and at the pressure, the substrate is exposed to a plasma effective to impart a reaction of the first material with the second material to form a reaction product third material of the first and second materials over the first material.

In one implementation, a method of forming a conductive metal silicide by reaction of metal with silicon includes providing a semiconductor substrate comprising a first material, where the first material comprises silicon in elemental form. A second material is formed over the first material. The second material comprises at least one of an elemental metal or a metal compound rich in metal. The first and second materials are received proximate one another at an interface. The first and second materials as being proximate one another at the interface are capable of reacting with one another at some minimum reaction temperature when in an inert non-plasma atmosphere at a pressure to form a metal silicide. The interface is provided at a processing temperature which is at least 50° C. below the minimum reaction temperature and at the pressure. With the interface at the processing temperature and at the pressure, the substrate is exposed to a plasma effective to impart a reaction of the first material with the second material to form a metal silicide on the first material. The plasma is inert to reaction with both the silicon and the at least one of the elemental metal and the metal compound, and inert to deposition of material over the second material.

Other aspects and implementations are contemplated.

BRIEF DESCRIPTION OF THE DRAWINGS

Preferred embodiments of the invention are described below with reference to the following accompanying drawings.

FIG. 5 is a diagrammatic equation of exemplary process aspects in accordance with a part of the invention.

FIG. 6 is a diagrammatic equation of exemplary process aspects in accordance with a part of the invention.

FIG. 7 is a diagrammatic equation of exemplary process aspects in accordance with a part of the invention.

FIG. 8 is a diagrammatic equation of exemplary process aspects in accordance with a part of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
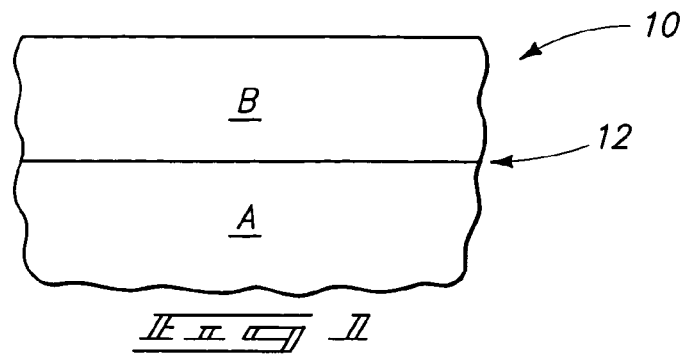
FIG. 1 is a diagrammatic sectional view of a semiconductor wafer fragment in process in accordance with an aspect of the invention.

Exemplary preferred methods of forming reaction products, including conductive metal silicides by the reaction of metal with silicon, are described with reference to FIGS. 1–18. FIG. 1 diagrammatically depicts a semiconductor substrate indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 3:
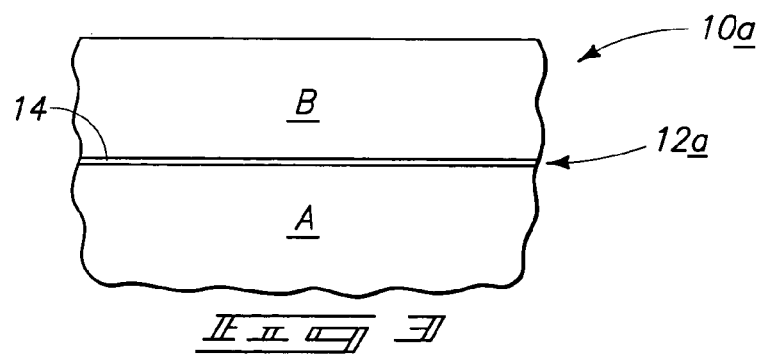
FIG. 3 is a diagrammatic sectional view of an alternate embodiment semiconductor wafer fragment in process in accordance with an aspect of the invention.

Semiconductor substrate 10 comprises some first material A having some second material B formed thereover. First material A and second material B are of different compositions and are received proximate one another at an interface 12. In the illustrated exemplary preferred embodiment of FIG. 1, first material A and second material B contact one another at interface 12. FIG. 3 illustrates an alternate exemplary embodiment semiconductor substrate 10a. Like numerals from the first described embodiment are utilized where appropriate, with differences being indicated with the suffix "a" or with different numerals. Interface 12a of semiconductor substrate 10a in FIG. 3 is characterized by a layer or layers 14 interposed between first material A and second material B such that these materials are not contacting one another at interface 12a. Regardless, first material A and second material B as being proximate one another at interface 12/12a are capable of reacting with one another at some minimum reaction temperature when in an inert non-plasma atmosphere at some selected pressure. Accordingly, even where first material A and second material B are not contacting one another, conditions can exist where, at some minimum reaction temperature, one or both of materials A and B effectively diffuse through layer(s) 14 effective to impart a reaction of one with the other. In the context of this document, a material A being proximate a material B requires either a contacting relationship or separation of materials A and B from one another by one or more materials in an area of reaction wherein the separation distance is no greater than 50 Angstroms.

Interface 12/12a is provided at a processing temperature which is at least 50° C. below the stated minimum reaction temperature. Further, the interface is also provided at the pressure referred to above at which the above-stated reacting can occur if at or above the minimum reaction temperature at such pressure. Accordingly, the interface provided as just so stated does not result in the reaction of material A with material B at this point in the process. Preferably, the processing temperature at which the interface is provided is no greater than 300° C. below such minimum reaction temperature, more preferably no greater than 100° C. below the minimum reaction temperature, even more preferably no greater than 75° C. below the minimum reaction temperature, and further preferably no greater than 60° C. below the minimum reaction temperature. For example, titanium metal received on silicon has a minimum reaction temperature in the absence of plasma of 600° C. at 10 Torr. In one exemplary aspect with these materials, the processing temperature is provided to be not greater than 550° C., in one embodiment from 300° C. to 550° C., in one embodiment from 500° C. to 550° C., in one embodiment from 525° C. to 550° C., and in one embodiment from 540° C. to 550° C., and at 10 Torr with no appreciable reaction occurring to form titanium silicide. The artisan knows or can readily determine the minimum reaction temperature at a given pressure in a non-plasma inert atmosphere for reaction capable first and second materials that are received proximate one another.

Figure 2:
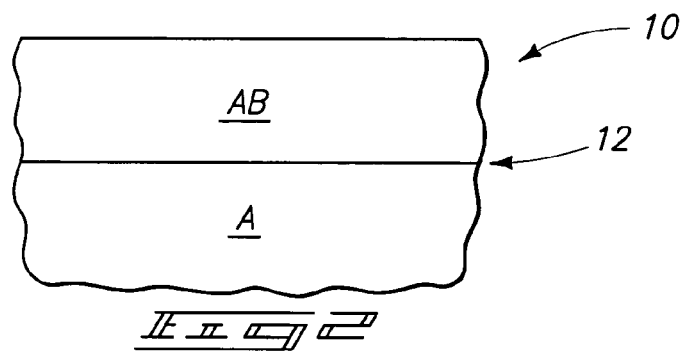
FIG. 2 is a view of the FIG. 1 fragment at a processing step subsequent to that shown by FIG. 1.
Figure 4:
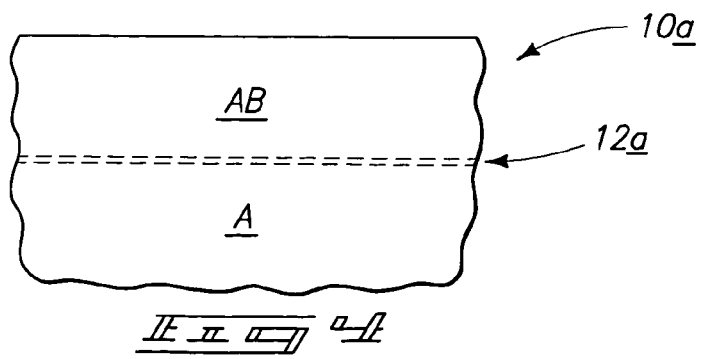
FIG. 4 is a view of the FIG. 3 fragment at a processing step subsequent to that shown by FIG. 4.

Referring to FIGS. 2 and 4, and with interface 12/12a at the processing temperature and pressure, substrate 10/10a is exposed to a plasma effective to impart a reaction of first material A with second material B to form a reaction product third material AB of first material A and second material B over first material A. Plasma exposure can start prior to the interface being at the minimum reaction temperature and at the pressure or start after the interface is already at the minimum reaction temperature and at the pressure. Regardless in such processing, all of material B might react to form AB, or only a portion thereof might so react thus forming a B-AB-A composite. Accordingly and regardless, a reaction of A and B to form AB is imparted at a temperature below which such would otherwise occur at the pressure the substrate is at. Therefore, second material B should not be too thick to preclude the stated reaction from occurring at interface 12/12a. In one exemplary preferred embodiment, it is expected that second material B should thereby be formed to a thickness no greater than 75 Angstroms, and more preferably to a thickness no greater than 25 Angstroms. However, such is expected to be dependent upon the plasma ion energy and plasma density utilized, and the density and other attributes of second material B. Regardless in one exemplary preferred embodiment, the plasma during the exposing has a density from $1\times10^{11}$ ions/cm$^3$ to $1\times10^{13}$ ions/cm$^3$. Further, the plasma exposing preferably comprises some substrate bias to facilitate the targeting of the plasma at the substrate. Preferably, the substrate bias is at a frequency of about 400 kHz or 13.56 mHz. Where a bias voltage is utilized, such is preferably no greater than 100V. An exemplary preferred pressure range for the processing is from 1 mTorr to 20 Torr, and with plasma power at from 100 Watts to 5000 Watts. Another method uses inductively coupled plasma to create the plasma (separate from substrate bias) to get independent control of plasma ion energy and plasma ion density.

In one preferred implementation, the plasma to which the substrate is exposed is inert to reaction with both first material A and second material B, and inert to the deposition of any material over second material B. Exemplary inert plasmas are derived from a gas selected from the group consisting of He, Ar, Ne, Xe, Kr and mixtures thereof. A specific exemplary preferred example for Ti, and by way of example only, includes a plasma generated by inductively coupled plasma, 2000 W for the inductive source power, a substrate bias of 200 W, chamber pressure regulated to 10 mTorr, Ar flow at 100 sccm and a substrate temperature of 500° C., preferably producing a plasma density of from $1\times10^{11}$ ions/cm$^3$ to $1\times10^{13}$ ions/cm$^3$.

In one implementation, the exposing to plasma might be void of ion implantation, and in another might comprise ion implantation (by way of example only, plasma immersion ion implantation for example as described in En et al., "Plasma Immersion Ion Implantation Reactor Design Considerations For Oxide Charging", Surface and Coatings Technology 85 (1996) 64–69). Further in one preferred embodiment, the method of forming the reaction product is entirely void of any ion implantation at the interface.

In one embodiment, the plasma comprises some material which reacts with the second material to form a reaction product fourth material over the reaction product third material. Such is diagrammatically depicted in FIG. 16. There shown is a plasma comprising a material C which reacts with second material B to form a reaction product fourth material BC over reaction product third material AB. Regardless, the stated first, second, third and fourth materials may be any one or combination of insulative, conductive and semiconductive materials. For example and by way of examples only, each of the first and second materials might be conductive, with the third material being insulative. Alternately, each of the first and second materials could be conductive, with the third material being conductive. Alternately, each of the first and second materials could be insulative, with the third material being insulative. Alternately, each of the first and second materials could be insulative, with the third material being conductive. Alternately, one of the first and second materials could be insulative and the other of the first and second materials being conductive, with the third material being insulative. Alternately, one of the first and second materials could be insulative and the other of the first and second materials being conductive, with the third material being conductive. Alternately, one of the first and second materials could be conductive and the other of the first and second materials being semiconductive, with the third material being conductive. Alternately, one of the first and second materials could be conductive and the other of the first and second materials being semiconductive, with the third material being insulative.

For example, FIG. 5 diagrammatically depicts a first material comprising titanium, a second material comprising aluminum, and a reaction product third material comprising TiAl$_x$. In this and all of the above and below examples, the stated first and second materials could of course be reversed, for example as depicted in FIG. 6 as compared to FIG. 5.

FIG. 7 depicts an example where the first and second materials are each conductive, and the third material is insulative. Here, one of the first and second materials comprises TiN and the other of the first and second materials comprises B, with the third material comprising BN.

Figure 9:
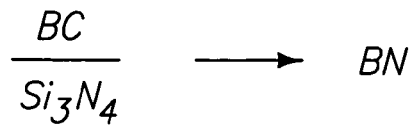
FIG. 9 is a diagrammatic equation of exemplary process aspects in accordance with a part of the invention.

By way of example only, FIGS. 8 and 9 depict instances where the first and second materials are each insulative, and the third material is insulative. FIG. 8 depicts one of the first and second materials as comprising boron carbide, and the other of the first and second materials comprising SiO$_2$, with the third material comprising B$_2$O$_3$. FIG. 9 depicts one of the first and second materials comprising boron carbide, and the other of the first and second materials comprising Si$_3$N$_4$, with the third material comprising BN.

Figure 10:
FIG. 10 is a diagrammatic equation of exemplary process aspects in accordance with a part of the invention.

FIG. 10 depicts an example where the first and second materials are each insulative, and the third material is conductive. In this example, one of the first and second materials comprises carbon (i.e., diamond, graphite, etc.) and the other of the first and second materials comprises SiO$_2$, with the third material comprising SiC.

Figure 11:
FIG. 11 is a diagrammatic equation of exemplary process aspects in accordance with a part of the invention.

FIG. 11 depicts an example where one of the first and second materials is insulative and the other of the first and second materials is conductive, with the third material being conductive. Specifically, FIG. 11 shows one of the first and second materials comprising titanium and the other of the first and second materials comprising Si$_3$N$_4$, with the third material comprising at least one of TiN or TiSi$_x$.

Figure 12:
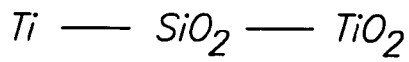
FIG. 12 is a diagrammatic equation of exemplary process aspects in accordance with a part of the invention.

FIG. 12 shows a similar example, but where the third material is insulative. Specifically, one of the first and second materials comprises SiO$_2$ and the other of the first and second material comprises Ti, with the third material comprising TiO$_2$.

Figure 13:
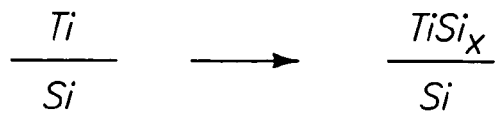
FIG. 13 is a diagrammatic equation of exemplary process aspects in accordance with a part of the invention.
Figure 14:
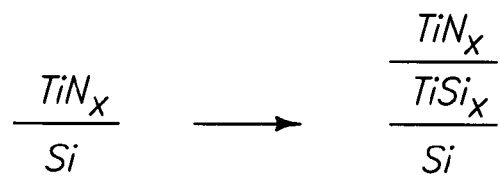
FIG. 14 is a diagrammatic equation of exemplary process aspects in accordance with a part of the invention.

FIGS. 13 and 14 depict examples wherein at least one of the first and second materials is semiconductive, and including wherein the other of the first and second materials is conductive. FIG. 13 depicts the semiconductive materials comprising silicon, with the other of the first and second materials comprising titanium, and with the third material comprising TiSi$_x$. FIG. 14 depicts the semiconductive material comprising silicon, the other of the first and second materials comprising titanium nitride, and with the third material comprising TiSi$_x$. Again with this and any of the examples stated herein, only some or all of the outermost layer might be consumed in the reaction.

Figure 15:
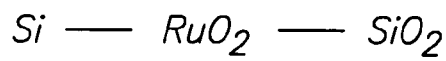
FIG. 15 is a diagrammatic equation of exemplary process aspects in accordance with a part of the invention.
Figure 16:
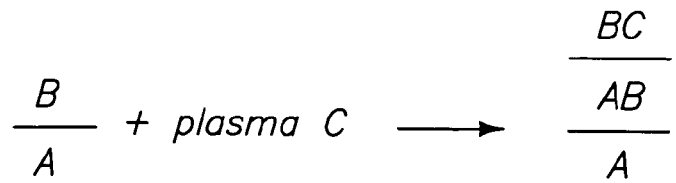
FIG. 16 is a diagrammatic equation of exemplary process aspects in accordance with a part of the invention.

FIG. 15 depicts an example where one of the first and second materials is semiconductive, the other of the first and second materials is conductive, and the third material is insulative. Specifically, there depicted is one of first and second materials comprising Si and the other of the first and second materials comprising RuO$_2$, with the third material comprising SiO$_2$.

Figure 17:
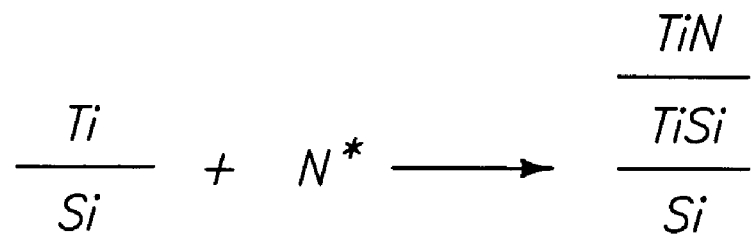
FIG. 17 is a diagrammatic equation of exemplary process aspects in accordance with a part of the invention.
Figure 18:
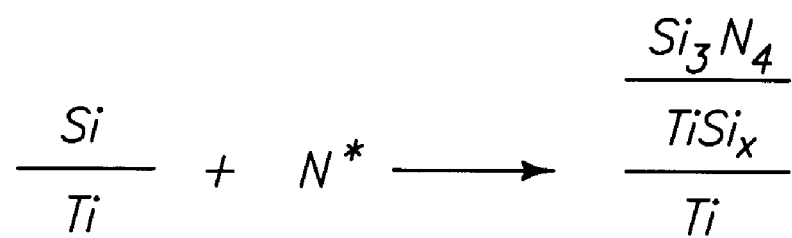
FIG. 18 is a diagrammatic equation of exemplary process aspects in accordance with a part of the invention.

By way of example only, FIGS. 17 and 18 depict instances where the plasma comprises a material which reacts with the second material to form a reaction product fourth material over the reaction product third material. The specific depicted examples are relative to plasma material which comprises nitrogen, with such being depicted by N*, although other reactive plasma materials are of course contemplated. FIG. 17 depicts the second material as comprising elemental titanium, the first material as comprising silicon, the third material as comprising titanium silicide, and the fourth material comprising titanium nitride. By way of example only, FIG. 18 depicts the first material comprising elemental titanium, the second material comprising silicon, the third material comprising $TiSi_x$, and the fourth material comprising silicon nitride.

In one exemplary preferred embodiment, the second material comprises at least one of elemental metal or a metal compound rich in metal. In one exemplary implementation, the second material consists essentially of one of these materials. Exemplary preferred materials include Co, Ta, Ti, W, Pt, Rh, Ru, silicides thereof, including mixtures thereof and including mixtures of silicides. In this particular example as with the others, the first and second materials as being proximate one another at an interface are capable of reacting with one another at some minimum reaction temperature when in an inert non-plasma atmosphere at a pressure to form a metal silicide. As above, the interface is provided at a processing temperature which is at least 50° C. below the minimum reaction temperature and at the pressure. The substrate is exposed to a plasma effective to impart a reaction of the first material with the second material to form a metal silicide on the first material. Most preferably, the plasma is inert to reaction with both the silicon and the at least one of the elemental metal and the metal compound, as well as being inert to the deposition of any material over the second material. Other exemplary preferred attributes are as described above.

In this particular example, the preferred thickness range for the metal silicide which is formed on the first material is from 5 Angstroms to 100 Angstroms.

Processing as described in the above exemplary preferred embodiments can produce certain unexpected advantages and results. However, such advantages or results do not constitute part of the invention unless literally appearing in a particular claim under analysis. For example with respect to any silicide formation, the exposing and reaction can result in better control (less variation) in the thickness of the metal silicide formed by the reaction. Accordingly in one implementation, the exposing and reaction are effective to form all conductive metal silicide formed over the substrate by the reaction to have no more than 10% thickness variation as determined as the percentage of the thickness portion of the conductive metal silicide formed by the reaction. In another preferred implementation, such thickness variation is from 1% to 3%, and in another preferred embodiment to have no more than 1% of such thickness variation.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a reaction product, comprising:
    providing a semiconductor substrate comprising a first material;
    forming a second material over the first material, the first and second materials being of different compositions and being proximate one another at an interface, the first and second materials as being proximate one another at the interface being capable of reacting with one another at some minimum reaction temperature when in an inert non-plasma atmosphere at a pressure;
    providing the interface at a processing temperature which is at least 50° C. below the minimum reaction temperature and at the pressure; and
    with the interface at the processing temperature and at the pressure, exposing the substrate to a plasma effective to impart a reaction of the first material with the second material to form a reaction product third material of the first and second materials over the first material.

2. The method of claim 1 wherein the first and second materials contact one another at the interface prior to the exposing.

3. The method of claim 1 wherein the first and second materials do not contact one another at the interface prior to the exposing.

4. The method of claim 1 wherein the exposing starts prior to providing the interface at the processing temperature at the pressure.

5. The method of claim 1 wherein the exposing starts after providing the interface at the processing temperature at the pressure.

6. The method of claim 1 wherein the second material is formed to a thickness no greater than 75 Angstroms.

7. The method of claim 6 wherein the second material is formed to a thickness no greater than 25 Angstroms.

8. The method of claim 1 wherein the plasma is inert to reaction with both the first and second materials and inert to deposition of material over the second material.

9. The method of claim 8 wherein the plasma is derived from a gas selected from the group consisting of He, Ar, Ne, Xe, Kr and mixtures thereof.

10. The method of claim 1 wherein the plasma comprises a material which reacts with the second material to form a reaction product fourth material over the reaction product third material.

11. The method of claim 10 wherein the plasma material comprises nitrogen, the first material comprises silicon, the second material comprises elemental titanium, the third material comprises titanium silicide, and the fourth material comprises titanium nitride.

12. The method of claim 10 wherein the plasma material comprises nitrogen, the first material comprises elemental titanium, the second material comprises silicon, the third material comprises titanium silicide, and the fourth material comprises silicon nitride.

13. The method of claim 1 wherein the first and second materials are each conductive.

14. The method of claim 13 wherein the third material is conductive.

15. The method of claim 14 wherein one of the first and second materials comprises titanium and the other of the first and second materials comprises aluminum, the third material comprising $TiAl_x$.

16. The method of claim 13 wherein the third material is insulative.

17. The method of claim 16 wherein one of the first and second materials comprises TiN and the other of the first and second materials comprises B, the third material comprising BN.

18. The method of claim 1 wherein the first and second materials are each insulative.

19. The method of claim 18 wherein the third material is conductive.

20. The method of claim 19 wherein one of the first and second materials comprises carbon and the other of the first and second materials comprises $SiO_2$, the third material comprising SiC.

21. The method of claim 18 wherein the third material is insulative.

22. The method of claim 21 wherein one of the first and second materials comprises boron carbide and the other of the first and second materials comprises $SiO_2$, the third material comprising $B_2O_3$.

23. The method of claim 21 wherein one of the first and second materials comprises boron carbide and the other of the first and second materials comprises $Si_3N_4$, the third material comprising BN.

24. The method of claim 1 wherein one of the first and second materials is insulative and the other of the first and second materials is conductive.

25. The method of claim 24 wherein the third material is conductive.

26. The method of claim 25 wherein one of the first and second materials comprises titanium and the other of the first and second materials comprises $Si_3N_4$, the third material comprising at least one of TiN or $TiSi_x$.

27. The method of claim 24 wherein the third material is insulative.

28. The method of claim 27 wherein one of the first and second materials comprises $SiO_2$ and the other of the first and second materials comprises Ti, the third material comprising $TiO_2$.

29. The method of claim 1 wherein at least one of the first and second materials is semiconductive.

30. The method of claim 29 wherein the third material is conductive.

31. The method of claim 30 wherein the semiconductive material comprises silicon, the other of the first and second materials comprises elemental titanium, and the third material comprising $TiSi_x$.

32. The method of claim 30 wherein the semiconductive material comprises silicon, the other of the first and second materials comprises titanium nitride, and the third material comprising $TiSi_x$.

33. The method of claim 29 wherein the third material is insulative.

34. The method of claim 33 wherein one of the first and second materials comprises Si and the other of the first and second materials comprises $RuO_2$, the third material comprising $SiO_2$.

35. The method of claim 1 wherein the processing temperature is no greater than 300° C. below the minimum reaction temperature.

36. The method of claim 1 wherein the processing temperature is no greater than 100° C. below the minimum reaction temperature.

37. The method of claim 1 wherein the processing temperature is no greater than 75° C. below the minimum reaction temperature.

38. The method of claim 1 wherein the processing temperature is no greater than 60° C. below the minimum reaction temperature.

39. The method of claim 1 wherein the third material is conductive.

40. The method of claim 39 wherein the third material comprises a silicide.

41. The method of claim 40 wherein the exposing is effective to form all conductive metal silicide on the first material to have no more than 10% thickness variation as determined of a thickest portion of said conductive metal silicide formed by the reaction.

42. The method of claim 40 wherein the exposing is effective to form all conductive metal silicide on the first material to have no more than 1% thickness variation as determined of a thickest portion of said conductive metal silicide formed by the reaction.

43. The method of claim 40 wherein the exposing is effective to form all conductive metal silicide on the first material to have from 1% to 3% thickness variation as determined of a thickest portion-of said conductive metal silicide formed by the reaction.

44. The method of claim 39 wherein the third material comprises $TiAl_x$.

45. The method of claim 1 wherein the third material is insulative.

46. The method of claim 1 wherein the plasma during the exposing has a plasma density from $1\times10^{11}$ ions/cm$^3$ to $1\times10^{13}$ ions/cm$^3$.

47. The method of claim 1 wherein the exposing comprises a substrate bias.

48. The method of claim 1 wherein the plasma comprises plasma immersion ion implantation.

49. The method of claim 1 wherein the exposing is void of ion implantation.

50. The method of claim 1 being void of ion implantation at the interface.

51. A method of forming a reaction product, comprising:
providing a semiconductor substrate comprising a first material;
forming a second material on the first material, the first and second materials being of different compositions and contacting against one another at an interface, the first and second materials as contacting against one another at the interface being capable of reacting with one another at some minimum reaction temperature when in an inert non-plasma atmosphere at a pressure;
providing the interface at a processing temperature which is at least 50° C. below the minimum reaction temperature and at the pressure; and
with the interface at the processing temperature and at the pressure, exposing the substrate to a plasma effective to impart a reaction of the first material with the second material to form a reaction product third material of the first and second materials over the first material, the plasma being inert to reaction with both the first and second materials and inert to deposition of material over the second material.

52. The method of claim 51 wherein the second material is formed to a thickness no greater than 75 Angstroms.

53. The method of claim 52 wherein the second material is formed to a thickness no greater than 25 Angstroms.

54. The method of claim 51 wherein the exposing starts prior to providing the interface at the processing temperature at the pressure.

55. The method of claim 51 wherein the exposing starts after providing the interface at the processing temperature at the pressure.

56. The method of claim 51 wherein the first and second materials are each conductive.

57. The method of claim 56 wherein the third material is conductive.

58. The method of claim 57 wherein one of the first and second materials comprises titanium and the other of the first and second materials comprises aluminum, the third material comprising $TiAl_x$.

59. The method of claim 56 wherein the third material is insulative.

60. The method of claim 59 wherein one of the first and second materials comprises TiN and the other of the first and second materials comprises B, the third material comprising BN.

61. The method of claim 51 wherein the first and second materials are each insulative.

62. The method of claim 61 wherein the third material is conductive.

63. The method of claim 62 wherein one of the first and second materials comprises carbon and the other of the first and second materials comprises $SiO_2$, the third material comprising SiC.

64. The method of claim 61 wherein the third material is insulative.

65. The method of claim 64 wherein one of the first and second materials comprises boron carbide and the other of the first and second materials comprises $SiO_2$, the third material comprising $B_2O_3$.

66. The method of claim 64 wherein one of the first and second materials comprises boron carbide and the other of the first and second materials comprises $Si_3N_4$, the third material comprising BN.

67. The method of claim 51 wherein one of the first and second materials is insulative and the other of the first and second materials is conductive.

68. The method of claim 67 wherein the third material is conductive.

69. The method of claim 68 wherein one of the first and second materials comprises titanium and the other of the first and second materials comprises $Si_3N_4$, the third material comprising at least one of TiN or $TiSi_x$.

70. The method of claim 67 wherein the third material is insulative.

71. The method of claim 70 wherein one of the first and second materials comprises $SiO_2$ and the other of the first and second materials comprises Ti, the third material comprising $TiO_2$.

72. The method of claim 51 wherein at least one of the first and second materials is semiconductive.

73. The method of claim 72 wherein the third material is conductive.

74. The method of claim 73 wherein the semiconductive material comprises silicon, the other of the first and second materials comprises titanium, the third material comprising $TiSi_x$.

75. The method of claim 72 wherein the third material is insulative.

76. The method of claim 75 wherein one of the first and second materials comprises Si and the other of the first and second materials comprises $RuO_2$, the third material comprising $SiO_2$.

77. The method of claim 51 wherein the processing temperature is no greater than 300° C. below the minimum reaction temperature.

78. The method of claim 51 wherein the processing temperature is no greater than 100° C. below the minimum reaction temperature.

79. The method of claim 51 wherein the processing temperature is no greater than 75° C. below the minimum reaction temperature.

80. The method of claim 51 wherein the processing temperature is no greater than 60° C. below the minimum reaction temperature.

81. The method of claim 51 wherein the third material is conductive.

82. The method of claim 81 wherein the third material comprises a silicide.

83. The method of claim 81 wherein the third material comprises $TiAl_x$.

84. The method of claim 51 wherein the third material is insulative.

85. The method of claim 51 wherein the plasma during the exposing has a plasma density from $1 \times 10^{11}$ ions/cm$^3$ to $1 \times 10^{13}$ ions/cm$^3$.

86. The method of claim 51 wherein the exposing comprises a substrate bias.

87. The method of claim 51 wherein the plasma comprises plasma immersion ion implantation.

88. The method of claim 51 wherein the exposing is void of ion implantation.

89. The method of claim 51 being void of ion implantation at the interface.

90. A method of forming a conductive metal silicide by reaction of metal with silicon, comprising:
providing a semiconductor substrate comprising a first material, the first material comprising silicon in elemental form;
forming a second material over the first material, the second material comprising at least one of an elemental metal or a metal compound rich in metal, the first and second materials being proximate one another at an interface, the first and second materials as being proximate one another at the interface being capable of reacting with one another at some minimum reaction temperature when in an inert non-plasma atmosphere at a pressure to form a metal silicide;
providing the interface at a processing temperature which is at least 50° C. below the minimum reaction temperature and at the pressure; and
with the interface at the processing temperature and at the pressure, exposing the substrate to a plasma effective to impart a reaction of the first material with the second material to form a metal silicide on the first material, the plasma being inert to reaction with both the silicon and the at least one of the elemental metal and the metal compound and inert to deposition of material over the second material.

91. The method of claim 90 wherein the second material is formed to a thickness no greater than 75 Angstroms.

92. The method of claim 91 wherein the second material is formed to a thickness no greater than 25 Angstroms.

93. The method of claim 90 wherein the exposing starts prior to providing the interface at the processing temperature at the pressure.

94. The method of claim 90 wherein the exposing starts after providing the interface at the processing temperature at the pressure.

95. The method of claim 90 wherein the second material comprises elemental metal.

96. The method of claim 95 wherein the second material consists essentially of elemental metal.

97. The method of claim 90 wherein the second material comprises a metal compound rich in metal.

98. The method of claim 97 wherein the second material consists essentially of one or more metal compounds rich in metal.

99. The method of claim 90 wherein the silicon and the at least one of a metal and metal compound contact one another at the interface prior to the exposing.

100. The method of claim 90 wherein the silicon and the at least one of a metal and metal compound do not contact one another at the interface prior to the exposing.

101. The method of claim 90 wherein the plasma is derived from a gas selected from the group consisting of He, Ar, Ne, Xe, Kr and mixtures thereof.

102. The method of claim 90 wherein the processing temperature is no greater than 300° C. below the minimum reaction temperature.

103. The method of claim 90 wherein the processing temperature is no greater than 10° C. below the minimum reaction temperature.

104. The method of claim 90 wherein the processing temperature is no greater than 75° C. below the minimum reaction temperature.

105. The method of claim 90 wherein the processing temperature is no greater than 60° C. below the minimum reaction temperature.

106. The method of claim 90 wherein the plasma during the exposing has a plasma density from $1 \times 10^{11}$ ions/cm$^3$ to $1 \times 10^{13}$ ions/cm$^3$.

107. The method of claim 90 wherein the exposing comprises a substrate bias.

108. The method of claim 90 wherein the metal silicide formed on the first material has a thickness of from 5 Angstroms to 100 Angstroms.

109. The method of claim 90 wherein the exposing is effective to form all conductive metal silicide on the first material to have no more than 10% thickness variation as determined of a thickest portion of said conductive metal suicide formed by the reaction.

110. The method of claim 90 wherein the exposing is effective to form all conductive metal silicide on the first material to have no more than 1% thickness variation as determined of a thickest portion of said conductive metal silicide formed by the reaction.

111. The method of claim 90 wherein the exposing is effective to form all conductive metal silicide on the first material to have from 1% to 3% thickness variation as determined of a thickest portion of said conductive metal silicide formed by the reaction.

112. The method of claim 90 wherein the plasma comprises plasma immersion ion implantation.

113. The method of claim 90 wherein the exposing is void of ion implantation.

114. The method of claim 90 being void of ion implantation at the interface.

* * * * *

UNITED STATES PATENT AND TRADEMARK OFFICE
CERTIFICATE OF CORRECTION

PATENT NO. : 7,153,769 B2 Page 1 of 1
APPLICATION NO. : 10/822118
DATED : December 26, 2006
INVENTOR(S) : Sandhu et al.

It is certified that error appears in the above-identified patent and that said Letters Patent is hereby corrected as shown below:

Col. 1, line 52, delete "suicide" before "roughness" and insert --silicide--.

Col. 13, line 8, claim 103, delete "10°" after "than" and insert --100°--.

Signed and Sealed this

Fourteenth Day of August, 2007

JON W. DUDAS
*Director of the United States Patent and Trademark Office*